United States Patent [19]

Hammerl et al.

[11] Patent Number: 5,792,685
[45] Date of Patent: Aug. 11, 1998

[54] THREE-DIMENSIONAL DEVICE LAYOUT HAVING A TRENCH CAPACITOR

[75] Inventors: Erwin Hammerl, Emerting, Germany; Jack A. Mandelman, Stormville, N.Y.; Bernhard Poschenrieder, Saint-Cloud, France; Alvin P. Short, Poughkeepsie, N.Y.; Radhika Srinivasan, Ramsey, N.J.; Reinhard J. Stengl, Stadtbergen, Germany; Herbert L. Ho, New Windsor, N.Y.

[73] Assignees: Siemens Aktiengesellschaft, Munich, Germany; International Business Machines Corporation, Armonk, N.Y.

[21] Appl. No.: 667,541

[22] Filed: Jun. 21, 1996

Related U.S. Application Data

[63] Continuation-in-part of Ser. No. 605,622, Feb. 22, 1996.

[51] Int. Cl.$^6$ ................................................ H01L 21/8242
[52] U.S. Cl. ........................... 438/243; 438/244; 438/245
[58] Field of Search ................................. 438/243–249, 438/386–392

[56] References Cited

U.S. PATENT DOCUMENTS

| | | | |
|---|---|---|---|
| 4,988,637 | 1/1991 | Dhong et al. | 438/245 |
| 5,302,541 | 4/1994 | Akazawa | 438/245 |
| 5,627,092 | 5/1997 | Alsmeier et al. | 438/388 |

*Primary Examiner*—Jey Tsai
*Attorney, Agent, or Firm*—Dexter K. Chin

[57] ABSTRACT

Method for forming three-dimensional device structures comprising a second device formed over a first device is disclosed. A layer having a single crystalline top surface is formed above the first device to provide the base for forming the active area of the second device.

1 Claim, 16 Drawing Sheets

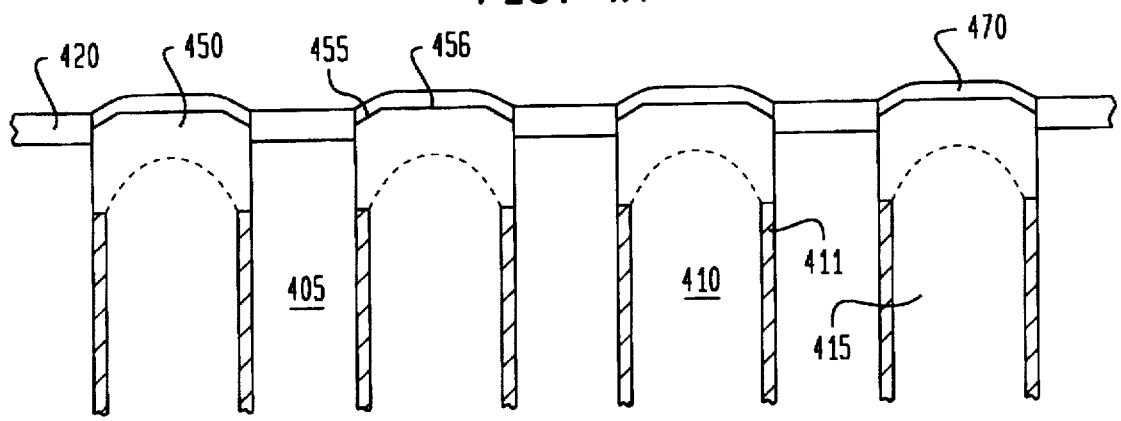
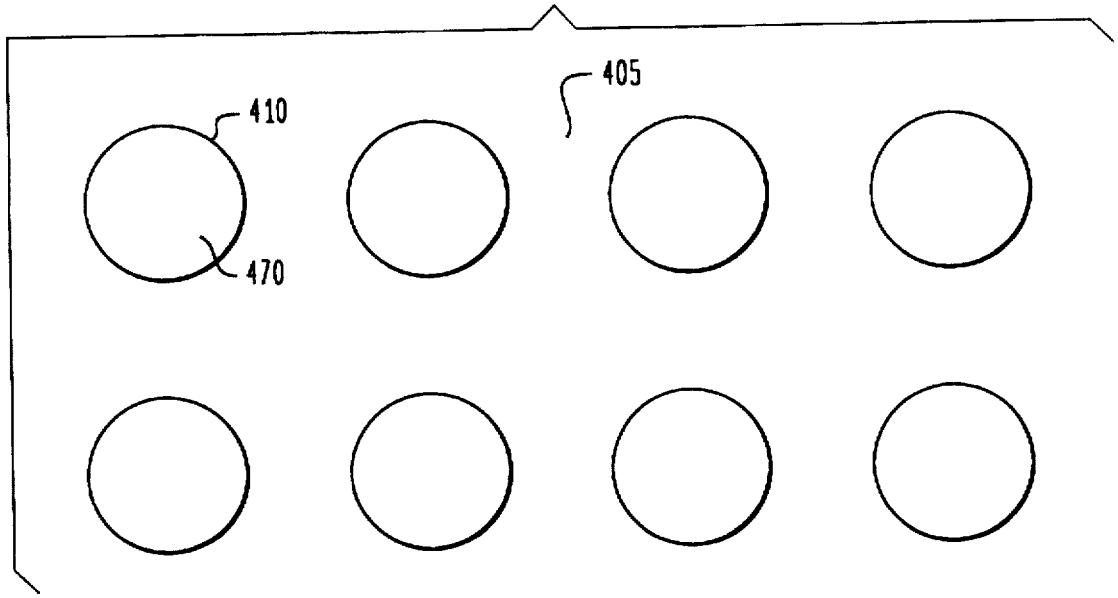

THREE-DIMENSIONAL DEVICE LAYOUT HAVING A TRENCH CAPACITOR

This application is a continuation-in-part of a U.S. Ser. No. 08/605,622 titled Buried-Strap Formation A DRAM Trench Capacitor filed Feb. 22, 1996.

FIELD OF INVENTION

The invention generally relates to a device, in particular a device having epitaxial layer formed over non-single crystalline material, and a process for fabricating such device.

BACKGROUND OF INVENTION

In device fabrication, insulating, semiconducting, and conducting layers are formed and patterned on a substrate to form devices, such as transistors, capacitors, and resistors. These devices are then interconnected to achieve a desired electrical function. The formation and patterning of the various device layers are achieved using conventional fabrication techniques, such as oxidation, implantation, deposition, epitaxial growth of silicon, lithography, and etching. Such techniques are described in S. M. Sze, *VLSI Technology*, 2nd ed., New York, McGraw-Hill, 1988, which is herein incorporated by reference for all purposes.

As device manufacturers are continually pressured to increase the density of devices per chip while decreasing chip size, the placement or layout of devices becomes more important. An effective technique of decreasing chip size without changing the design rule is to fabricate devices in a three-dimensional design layout instead of the conventional two-dimensional format. In the three-dimensional layout, devices are fabricated over other devices. As a result, vertical and horizontal integration of devices is achieved, thus utilizing chip area more efficiently than the two-dimensional layout which only integrates the devices horizontally.

Certain factors are taken into consideration in order to determine the layout of the devices. These factors include the type and quality of material on which the devices are fabricated. As an illustration, certain devices, such as an access transistor in a dynamic random access memory (DRAM) cell, are fabricated on single crystalline material with low defect density due to their performance needs. The high carrier mobility and low leakage currents associated with the single crystalline material having low defect density satisfies the performance requirements of such devices.

However, the need to fabricate certain devices on high quality single crystalline material limits the effectiveness of three-dimensional design layouts. Some devices, such as trench capacitors, are formed with polycrystalline (poly) material. Unfortunately, the poly does not provide an adequate base for devices with high operating performance requirements. Such devices, in conventional design layouts, are located in areas next to the trench capacitors where single crystalline material exists, thus limiting the size-reducing effect of three-dimensional design layouts.

From the above discussion, it is apparent that there is a need to increase the available area of high quality silicon for improved three-dimensional integration of devices.

SUMMARY OF INVENTION

A method for facilitating a three-dimensional device layout is disclosed. The device layout includes a device structure comprising a first device with a second device formed thereon. The first device, for example, is a trench capacitor, and the second device has an active area which, for example, is a transistor. The first device is formed in a substrate having a single crystalline structure with a pad layer formed thereon. The top of the first device, which comprises a non-single crystalline structure with a pad layer formed thereon. The top of the first device, which comprises a non-single crystalline material, is recessed below the surface of the substrate. As a result, a depression is formed in the substrate. An intermediate layer is formed in the depression by epitaxial growth techniques. In one embodiment, the epitaxial growth is selective to the substrate material and the top of the first device. Selective epitaxial growth focuses the growth of the intermediate layer in the depression. The intermediate layer typically is formed slightly above the plane of the pad layer. Epitaxial growth results in an intermediate layer having a single crystalline top surface. Planarization of the substrate produces a surface with a uniform planar topology. The second device is then formed on the single crystalline surface of the intermediate layer above the first device.

BRIEF DESCRIPTION OF DRAWINGS

FIGS. 4A–4B, 5A–5B, 6A–6B, 7A–7B, 8A–8C, 9A–9B, 10A–10B show various stages of forming a three-dimensional DRAM array;

DETAILED DESCRIPTION OF THE INVENTION

The present invention relates to three-dimensional design layouts in device fabrication. For purposes of illustration, the present invention is described in the context of a transistor device formed over a trench capacitor device. However, the invention is significantly broader and extends to the fabrication of devices having three-dimensional layouts in general, such as a first device with a second device fabricated thereon.

Figure 1:
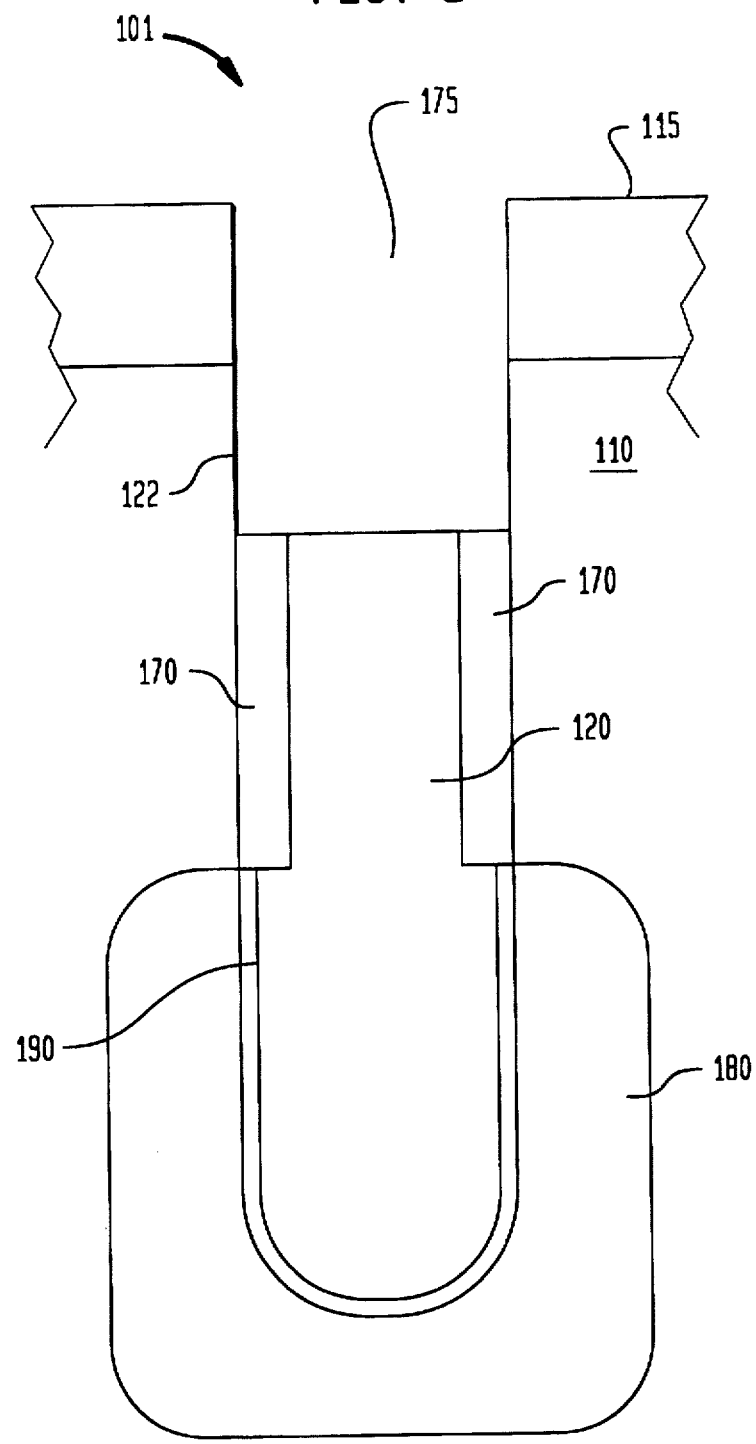
FIG. 1 shows a conventional trench capacitor.

Referring to FIG. 1, a trench capacitor fabricated by conventional techniques, such as those described in Nesbit et al., *A 0.6 μm² 256 Mb Trench DRAM Cell With Self-Aligned Buried Strap (BEST)*, IEDM Technical Digest (1993), which is herein incorporated herein by reference for all purposes, is shown. The capacitor is formed in a semiconductor substrate 110. Typically, the substrate is made from a single crystalline material. "Single crystalline material", as used herein, refers to a crystalline material in which the corresponding atomic planes are effectively parallel. Various materials which are well known to those skilled in the art are useful to form the substrate. Such materials, for example, include silicon, germanium, gallium arsenide, and group III–V compounds. Substrates that comprise a plurality of layers of material are also useful. These substrates, for example, include one type of single crystalline material formed on top of another type of single crystalline material (e.g., silicon on sapphire (SOS)), or amorphous or polycrystalline material recrystallized on a layer of amorphous material (e.g., silicon on insulator (SOI)).

In one embodiment, the substrate is a single crystalline silicon wafer prepared by the Czochralski technique. The major surface of the wafer is not critical, and any suitable orientation such as an <100>, <110>, or <111> is useful. Typically, the wafer has a <100> orientation because such a wafer is commonly available due to its low surface states and high carrier mobility. It is possible to heavily or lightly dope the substrate with impurity atoms, such as boron (B), phosphorus (P), arsenic (As), or antimony (Sb), to achieve the desired electrical characteristics.

In an exemplary embodiment, the trench capacitor is formed in a P-type <100> substrate doped with boron at a concentration of about $7 \times 10^{15} - 2 \times 10^{16}$. A pad nitride layer 115 is formed on the top surface of the substrate. The pad nitride forms an etch mask for the deep storage trenches and shallow isolation trenches. Typically, an oxide layer (not shown) of about 80 angstroms (Å) is formed on the silicon substrate prior to the formation of the nitride layer. The oxide layer promotes adhesion of the nitride layer to the substrate and reduces stress at the interfaces of the layers. Capacitor 101 comprises a trench region 120 which is filled with polysilicon (poly). The poly is doped with an N-type dopant such as As at about $5 \times 10^{19}$. Although the trench, as described, is doped with As, those skilled in the art will appreciate that a P-type doped poly may be useful in some applications. For example, a P-type poly is used to achieve a one volt shift in work function.

A N-type buried region 180 surrounds the lower portion of the trench. The buried region creates a P-N junction with the P-type substrate, thus forming one plate of the storage capacitor, which is isolated from the substrate. To form the buried region, the lower trench region is lined with N-type doped material such as As doped glass (ASG). After subjecting the substrate to high temperatures of, for example, about 1050° C. for about 30 minutes, the As dopant atoms diffuse into the P-type substrate, completing the formation of the buried region. Buried region forms the other plate of the capacitor referred to as a buried plate. A node dielectric layer 190 separates the two plates of the capacitor. As shown, the node dielectric comprises a layer of silicon nitride ($Si_3N_4$) and silicon dioxide ($SiO_2$). The layers of the node dielectric are formed by deposition of $Si_3N_4$, typically via chemical vapor deposition (CVD), and re-oxidation. An oxide collar 170 is formed along the sidewalls of the trench above the node dielectric layer using, for example, spacer etching techniques. The thickness of the collar should be sufficient to isolate the storage capacitor from the array device. Typically, the collar thickness is about 25–50 nm. The collar and poly are recessed, creating a depression 175 in the substrate wherein the silicon trench sidewalls 122 are exposed. For a trench of about 8 µm in depth, the collar and poly are recessed about 150 nm below the silicon surface.

The above is an overly simplified description of the conventional trench capacitor and the process steps used in its fabrication for purposes of illustration. Of course, the formation of the actual trench capacitor involves many more steps, such as, for example, steps removing the node dielectric from under the collar and deposition and removal of ASG. These steps are well-known and are described in Nesbit et al., *A 0.6 µm² 256 Mb Trench DRAM Cell With Self-Aligned Buried Strap (BEST)*, IEDM Technical Digest (1993), which is already herein incorporated by reference for all purposes. Furthermore, the dimensions described above are exemplary and may vary depending on the applicable groundrule.

After the fabrication of the trench, a single crystalline material is formed in the depression 175. By filling the trench with a single crystalline material, high performance devices such as access transistors can be fabricated on top of the trench. In accordance with the invention, the single crystalline material is formed using conventional chemical vapor deposition (CVD), also referred to as silicon vapor-phase epitaxial (epi) growth, as described in Sherman, *Chemical Vapor Deposition For Microelectronic Principle, Technology and Application*, Noyes Publication (1987), and Runyan et al. *Semiconductor Integrated Circuits Processing Technology*) Addison-Westley (1990), which are herein incorporated by reference for all purposes. The single crystalline layer is referred to as the epi layer. Epi growth techniques rely on the crystalline structure of the material on which the epi layer is to be grown to act as a seed crystal for the epi layer. As such, the epi layer typically assumes a structure similar to that of the material on which it is grown.

In general, epi growth is performed in a reactor comprising a quartz reaction chamber with a susceptor. The susceptor supports the substrate to facilitate a more uniform thermal environment. The formation of the epi layer involves chemical reactions of reactants being flowed into the chamber at high temperatures.

Various silicon sources or precursors, such as silicon tetrachloride ($SiCl_4$), dichlorosilane ($SiH_2Cl_2$), trichlorosilane ($SiHCl_3$), and silane ($SiH_4$), have been used for growing epi. The basic transport processes and reaction kinetics using the various precursors and reactants are described in, for example, Sherman, *Chemical Vapor Deposition For Microelectronic Principle, Technology and Application*, Noyes Publication (1987), which are herein incorporated by reference for all purposes.

In one embodiment, epi growth techniques which are "selective to silicon" are employed to form the single crystalline layer. "Selective to silicon" means that the epi layer forms only on silicon material. Since the nitride layer 115 typically surrounds the trench opening, the epi layer only grows in the trench area. Selective epi growth is performed at a temperature of between about 800° and 1150° C. The pressure in the reaction chamber is generally set between about 1 torr to about 1 atm. Hydrogen (H), $SiH_2Cl_2$, and Hydrogen Chloride (HCl) gases are pumped into the chamber to create a chemical reaction which forms the epi layer. The flow rate of the reactant gases are as follows: H is between about 1 and 200 s/m, and $SiH_2Cl_2$ and Hcl, which enhances the selecting of epi growth, are between about 100 and 1000 sccm each.

Alternatively, non-selective epi growth techniques are also useful. As known to those skilled in the art, selectivity depends on various factors such as, for example, HCl, reaction temperature, type of silicon precursor used, the type and the concentration of dopants. Thus, by varying these factors, selectivity can be enhanced, decreased or eliminated. Non-selective epi techniques grow epi over the pad nitride as well as silicon. Removal of the growth occurring over the nitride requires polishing and/or recess etching procedures.

Figure 2A:
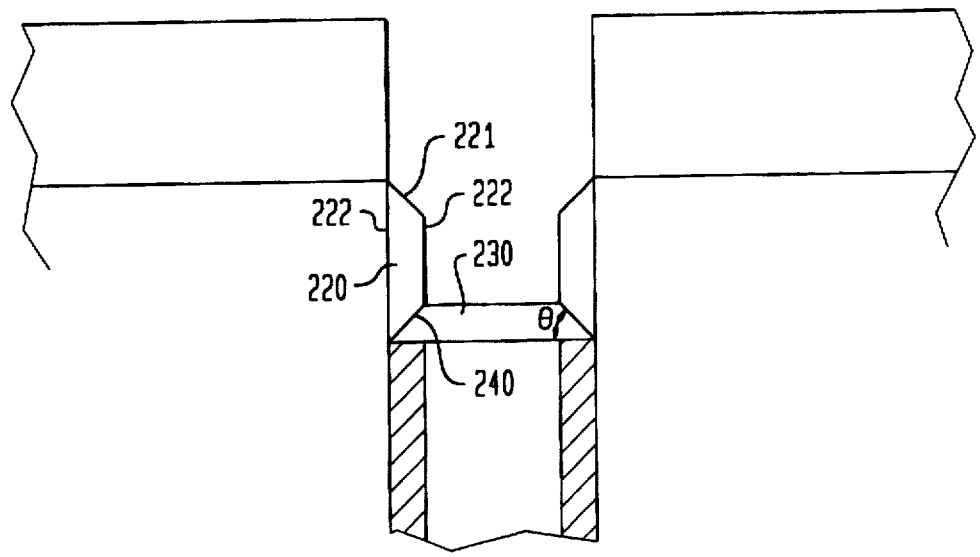
FIGS. 2A–2E show different formation stages of the epitaxial silicon layer over the trench.
Figure 2B:
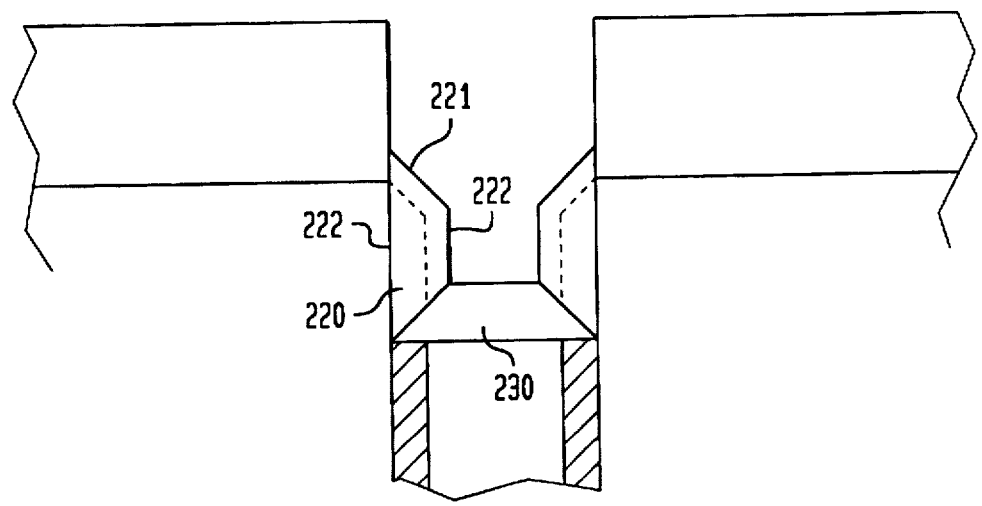

FIGS. 2A–2E show different stages of epi growth by selective epi techniques over time. The initial growth of the epi layer is shown in FIG. 2A. Because a selective epi technique is employed, growth occurs from the silicon sidewalls and the top of the poly in the trench. The growth 220 from the silicon sidewalls takes on a single crystalline structure. This single crystalline epi layer starts growing with <111> facets 221 and (110) and (100) top planes 222 from the trench sidewalls. With respect to the layer 230 growing from the top of the trench, it assumes a polycrystalline structure. As the epi and poly layers grow, they begin to merge and form an angle θ at the epi-poly interface 240, resulting in a cone shaped poly layer. The angle θ of the interface is determined by a <111> crystal plane, which is about 54° from the wafer surface. FIG. 2B shows the epi and poly layers as the growth process continues. The dotted lines indicate the growth of the layers at previous stage(s).

Figure 2C:
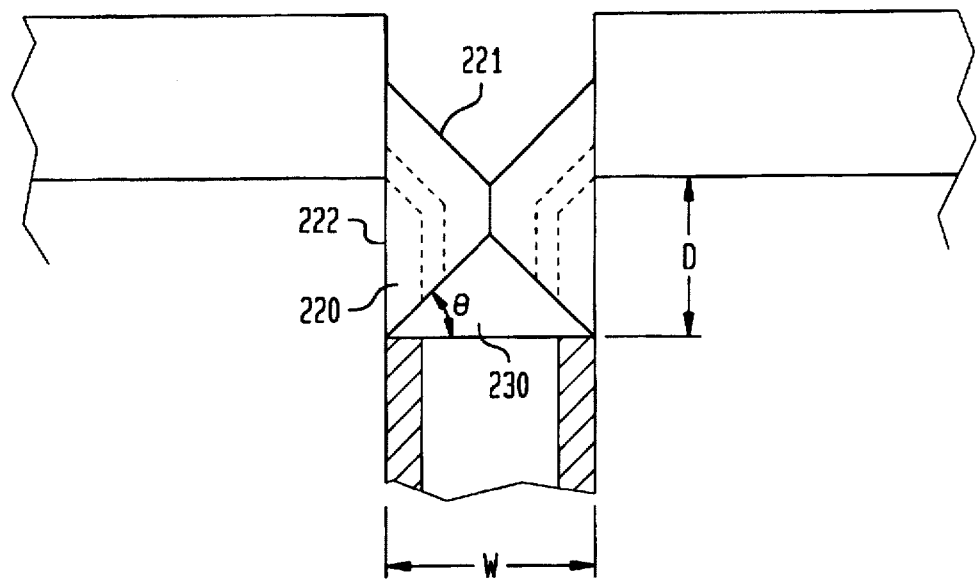

In FIG. 2C, the epi fronts from the trench sidewalls merge, forming a single crystalline layer on top of the poly cone 230. As discussed above, the poly growth is cone shaped because the epi-poly interface is formed at an angle from the trench sidewalls. The merging of the epi fronts is important to the successful formation of a single crystalline layer capping the poly filled trench. For instance, if the poly front squeezes in between the epi fronts and prevents their merger, then a single crystalline layer cannot be formed. To ensure the merging of the epi fronts, the depth D of the recessed area to be filled should be at least (W/2)tanθ, where W is the diameter of the recessed area (in the case where the trench is not circular or square, W is the diameter of the widest portion of the trench) and θ is the angle that the poly-epi interface forms with the wafer surface.

Figure 2D:
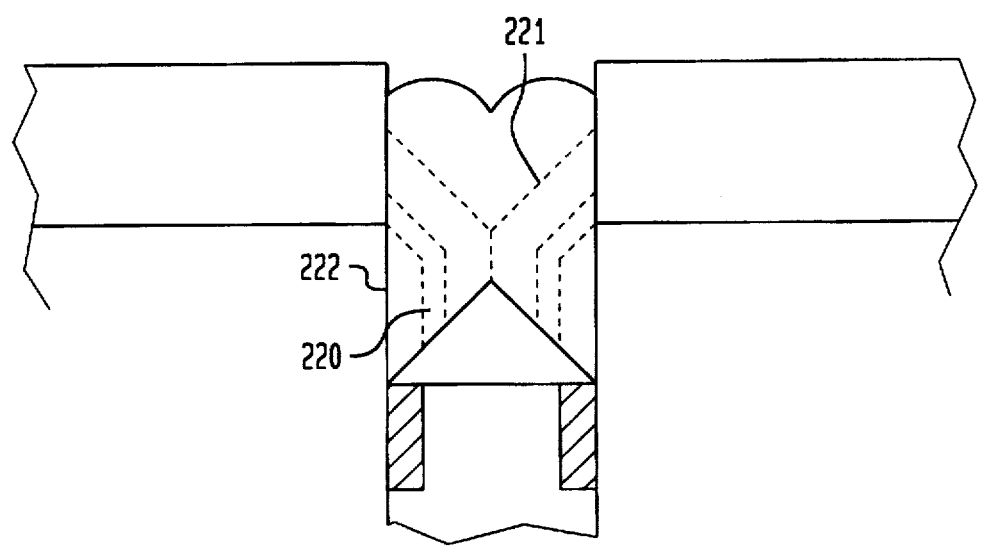
Figure 2E:
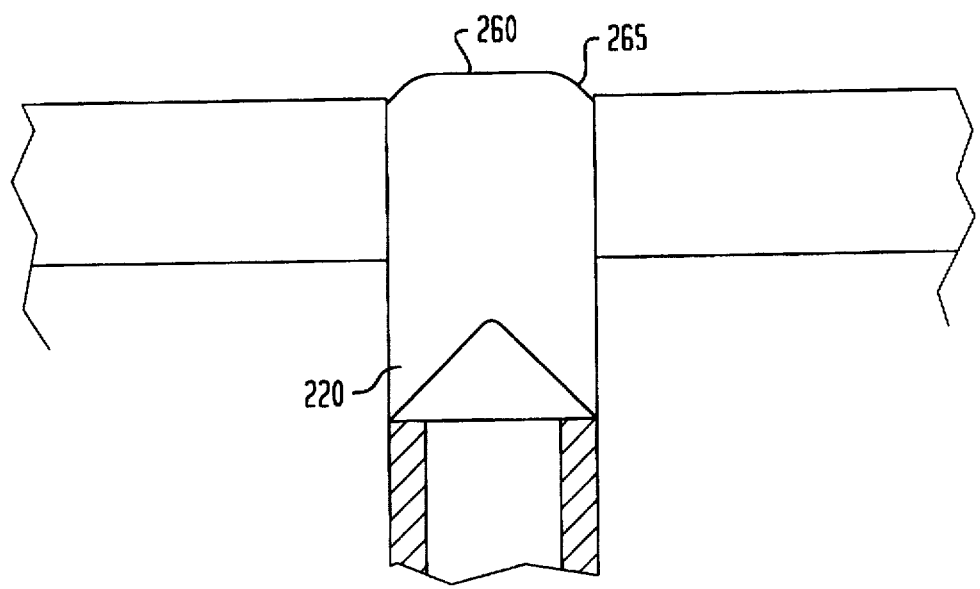

Referring to FIG. 2D, the growth process after the epi fronts have merged is shown. As shown, the epi growth at this stage is in a vertical direction from the <111> faceted surface 221. At the trench sidewalls, the epi layer tends to grow with <311> facets 265, as depicted in FIG. 2E. This faceted growth, along with the incubation effects of the epi surface, cause the epi to grow slower at the trench sidewalls than at the center, resulting in a convex epi surface 260. The top of the epi surface can be polished to provide a level <100> surface on which devices can be fabricated.

Figure 2F:
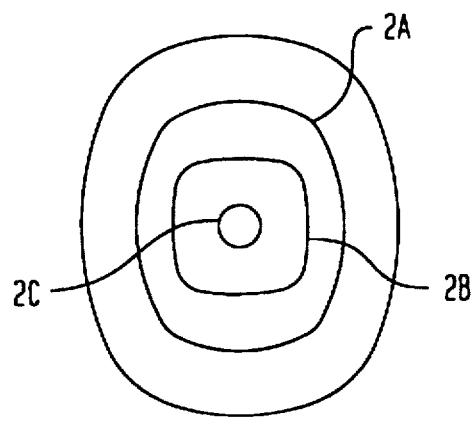
FIG. 2F shows a top view of different formation stages of the epitaxial silicon 3 layer.

FIG. 2F depicts a top view of the various stages of the epi growth in the trench. As shown, growth stages 2A–2C correspond to the growth stages depicted in FIGS. 2A–2C, respectively.

Figure 3:
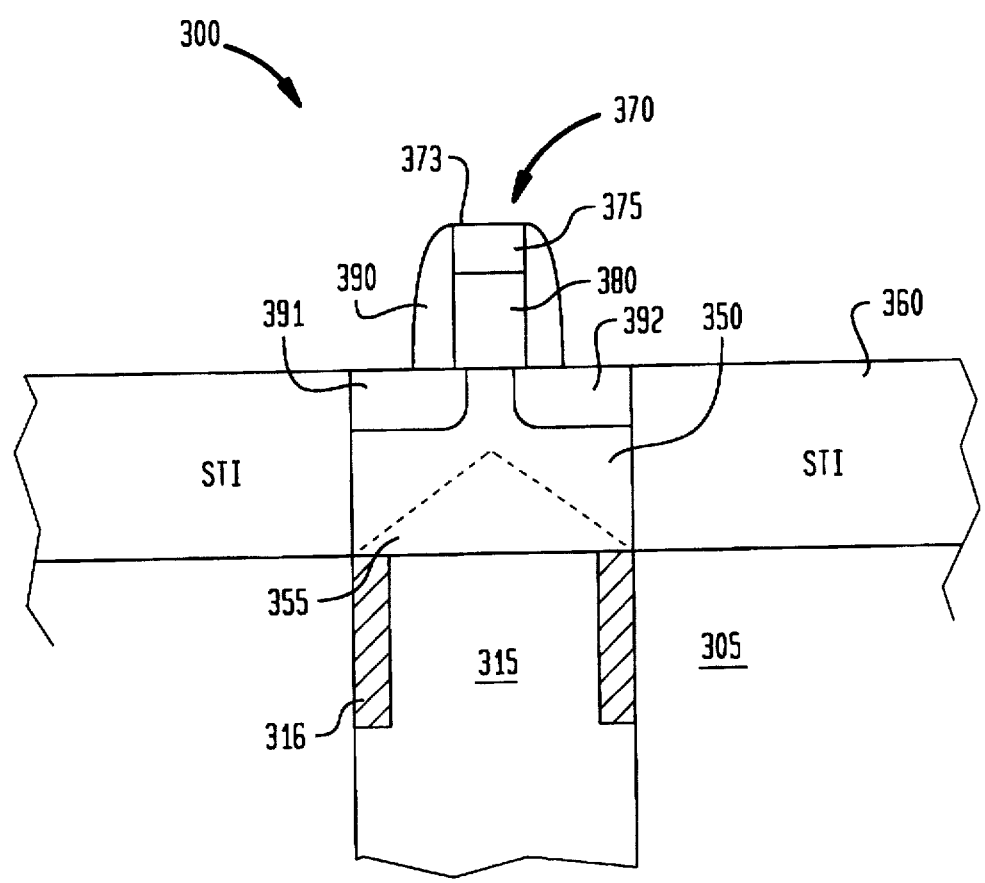
FIG. 3 shows an exemplary embodiment of a three-dimensional structure.

FIG. 3 is an illustrative embodiment of a three-dimensional structure 300. Such structure, for example, is implemented in a DRAM array. As shown, the structure includes a trench capacitor 315 formed in a semiconductor substrate 305, as described in FIG. 1. A collar oxide 316 surrounds the trench sidewalls. Above the trench capacitor, 315, an epi layer 350 is formed by epi growth techniques described in FIGS. 2a–2F. The dotted line 355 depicts the cone shaped poly-epi interface created by the epi growth process.

A transistor 370 is fabricated on the surface of the epi layer. The transistor has been simplified for purposes of illustration. The transistor is fabricated by conventional techniques, such as those described in Sze, VLSI Technology, which is already incorporated by reference for all purposes. The transistor includes a gate region 373, which typically comprises a poly layer 380 capped with a nitride layer 375 and gate sidewalls spacers 390. To reduce the sheet resistance of the gate region, a composite gate stack comprising silicides is used. Silicides, such as molybdenum ($MoSi_x$), tantalum ($TaSi_x$), tungsten ($WSi_x$), titanium silicide ($TiSi_x$), or cobalt silicide ($CoSi_x$), are useful to form the composite gate stack. Alternatively, aluminum or refractory metals, such tungsten and molybdenum, can be used alone or in combination with silicides or poly. Additionally, the transistor includes drain 391 and source 392 regions formed by implantation of dopants. Shallow trench isolation regions 360 are formed to isolate the DRAM structure 300 from other DRAM structures of the DRAM array.

FIGS. 4A and B–10A and B show the various stages of forming a three dimensional DRAM array incorporating the three-dimensional structure of FIG. 3. FIGS. 4A–10A depict the side view and FIGS. 4B–10B depict the corresponding top view of the array. Common structures within these FIGS. 4–10 are denoted by common numbers. Although the DRAM array, as shown, utilizes an open-bitline architecture, those skilled in the art will appreciate that other bitline architectures, such as a folded-bitline or variations thereof, are applicable.

Referring to FIGS. 4A–B, a substrate 405 with a pad nitride layer 420 is shown. The substrate includes an array of conventional trench capacitors 410 etched therein. For purposes of illustration, the top portion of the trenches are shown. As shown, the trench capacitors are filled with poly 415 and surrounded by an oxide collar 411. The poly-filled trenches are then recessed from the surface of the substrate. An epi layer 450 is then grown in the recessed areas to provide a single crystalline surface above the trenches. The top of epi layer includes <311> facets 455 and <100> planar surfaces 456. The epi layer is then oxidized, creating an oxide layer 470 having a thickness of about 20–30 nm.

Figure 5A:
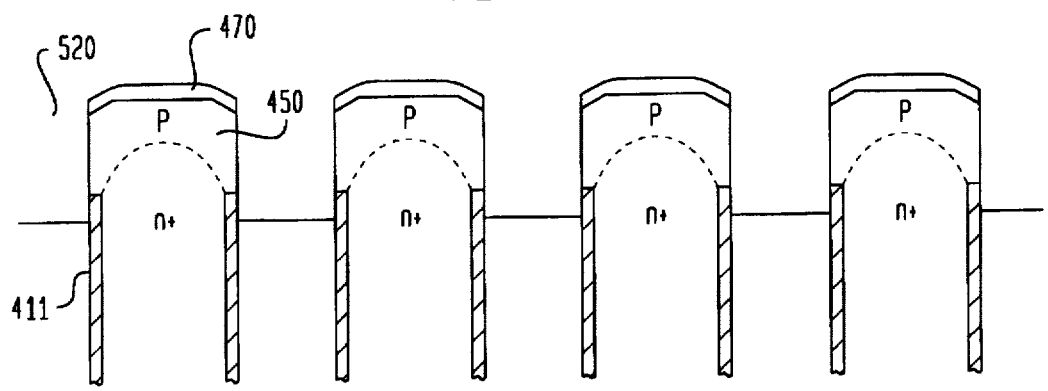
Figure 5B:
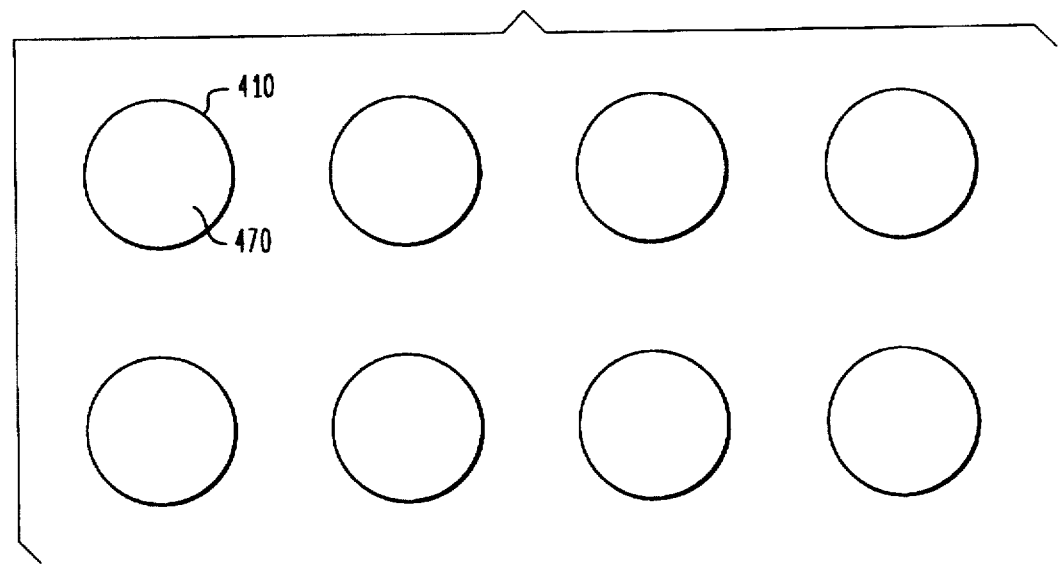

In FIG. 5A, the formation of shallow trenches 520 is shown. To form the shallow trenches, the pad nitride layer 420 (from FIG. 4A) is removed selective to oxide, enabling the removal of the pad nitride layer without removing the oxide 470 and epi layers 450. The silicon substrate is then recessed to a depth slightly below the collar oxide 411, which is about 200–300 nm to form the shallow trenches. A conventional reactive ion etch (RIE) technique is employed to recess the silicon. In order to avoid removal of the epi layer, the RIE is selective to oxide using conventional HCl chemistry. The selectivity to oxide of the RIE should be sufficient to remove the epi layer without removing the oxide layer. Typically the selectivity to oxide is about 100 or greater.

Figure 6A:
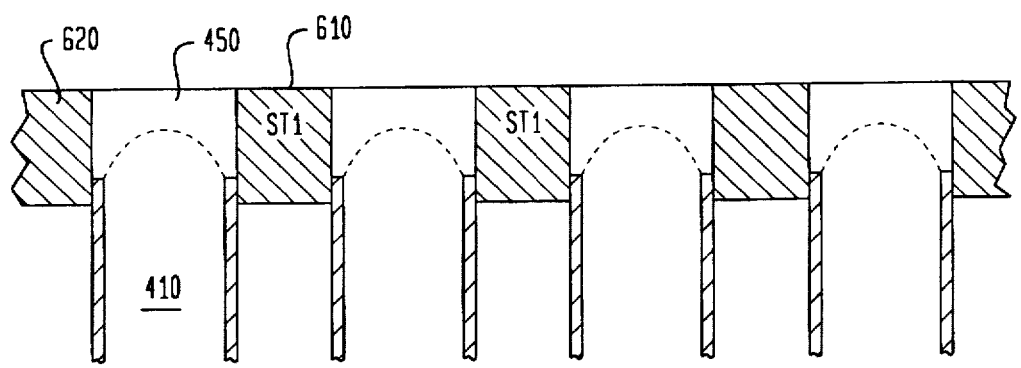
Figure 6B:
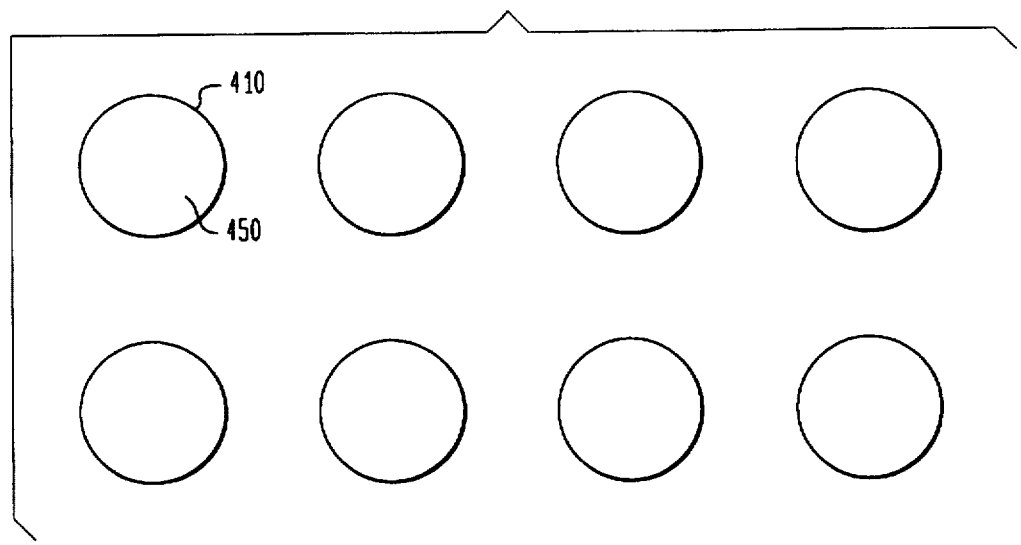

As shown in FIG. 6A, the shallow trenches are then filed with oxide 620, such as TEOS, by CVD. The surface of the substrate is then planarized to remove the nitride layer. The planarization process also removes the <311> facets of the of the epi layer, thus providing a planarized surface 610.

Figure 7A:
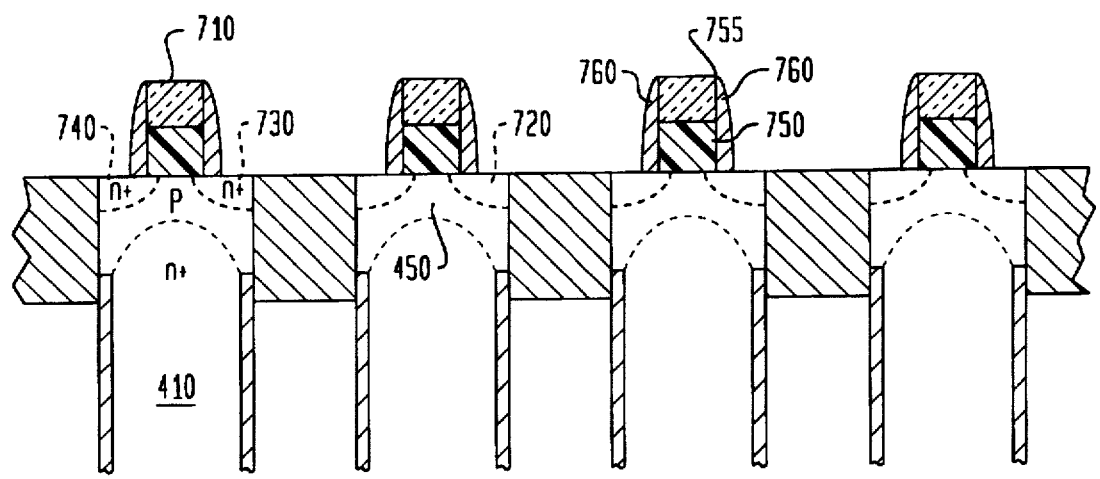
Figure 7B:
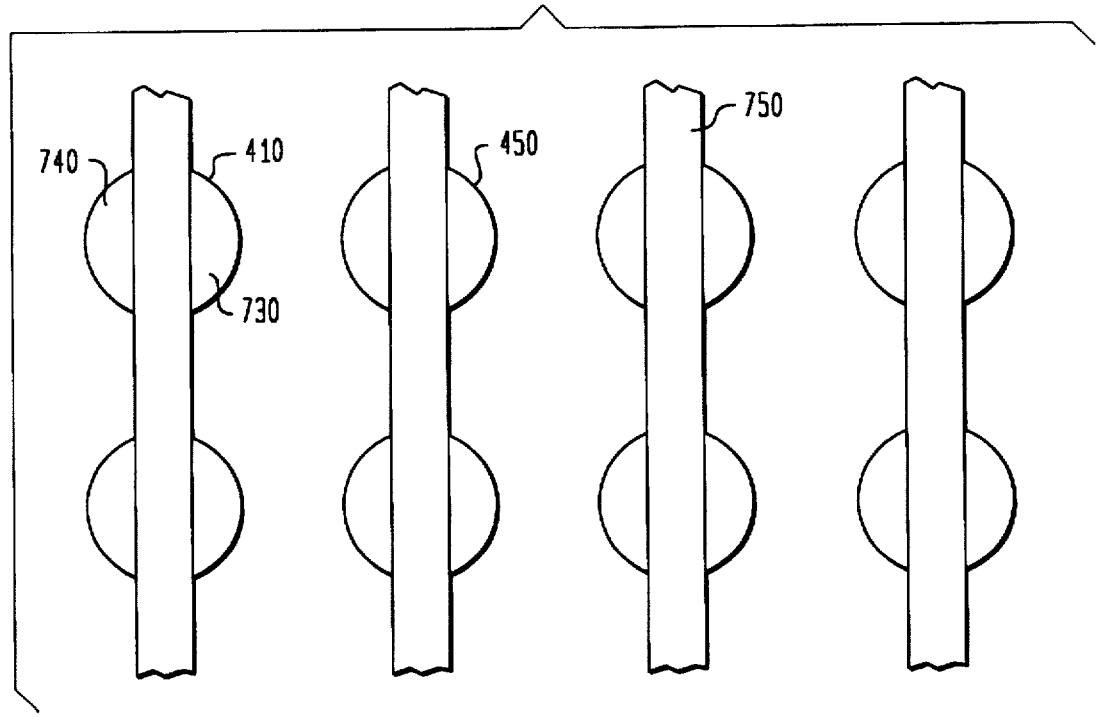

FIGS. 7A–B show transistors 710 formed on the epi layer 450 above the trench capacitors 410. The transistors are formed by, for example, forming a sacrificial oxide (not shown) over the epi surface 720 and implanting dopants through the sacrificial oxide to tailor the doping profile in the epi layer 450. As shown, the epi layer is implanted with a P-type dopant. After the epi layer has been doped, the sacrificial oxide layer is removed and a gate oxide is formed over the epi surface. Gate conductors, 750 are then formed. Illustratively, the gate conductors are capped with, for example, nitride layer 755. Insulating sidewall spacers 760 comprising, for example, of nitride, are formed on the side of the gate conductors. The gate conductors serve as the wordlines of DRAM array. Ion implantation is performed to form source 730 and drain 740 regions. As shown, the drain and source regions are implanted with N-type dopants. The drain and source regions are the bitline and node connections of the DRAM array. The various components of the transistors are formed using conventional techniques. Such techniques, for example, are described in S. M. Sze, *VLSI Technology*, 2nd ed., New York, McGraw-Hill, 1988, which is already incorporated by reference for all purposes.

Figure 8A:
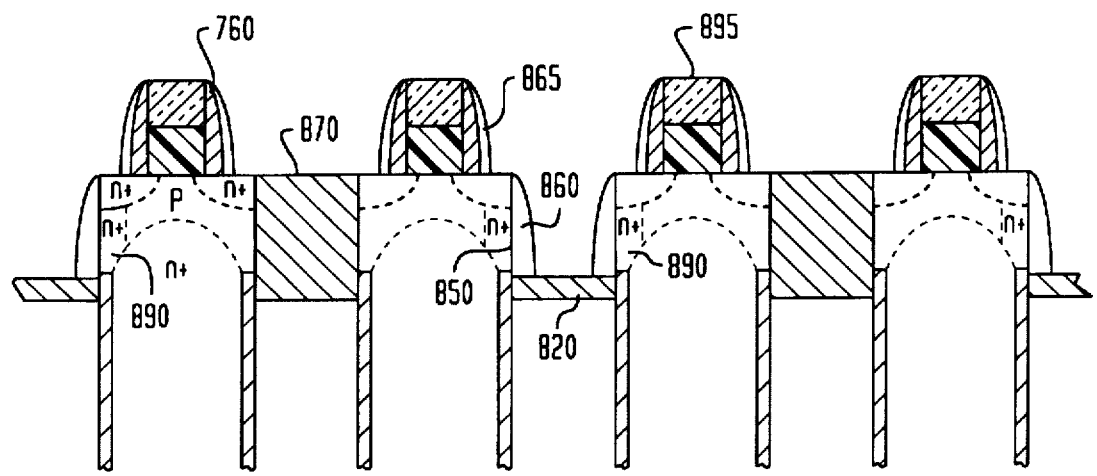
Figure 8B:
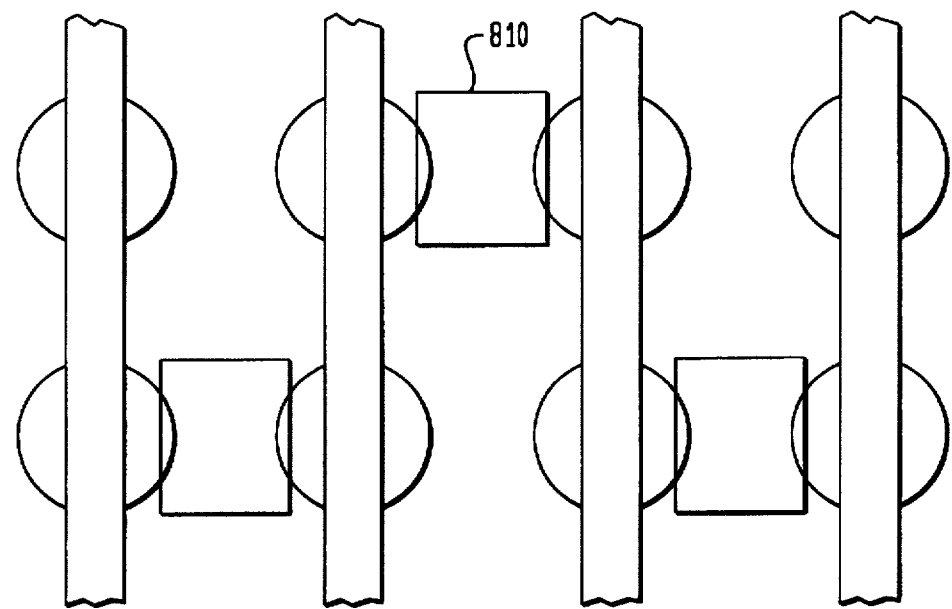

Referring to FIGS. 8A–B, a strap mask is used to define strap mask regions 810 between adjacent devices. Conventional RIE is performed to remove the TEOS in the strap mask regions 810. An isotropic chemical dry etch (CDE) should subsequently be performed to assure that the epi sidewalls are exposed. The CDE exposes the epi sidewalls 850, with a thin layer 820 of TEOS remaining. The thin layer, which is about 50 nm thick, serves as a diffusion barrier. Areas 870 between adjacent bitlines are protected by the strap mask and do not have any of the TEOS therein removed. A layer of N-type doped glass, such as arsenic doped glass (ASG) or phosphorous doped glass (PSG), is formed over the surface of the array and RIE is performed to form spacers 860 on the exposed epi sidewalls 850 and spacers 865 over the gate nitride spacers 760. Typically, DRAM array with N-type channel transistors employs N-type and P-type channel transistors for peripheral support devices such as decoders. To protect the P diffusions in the drain and source regions of the P-type channel transistors, the N-type doped spacers on these P-type channel transistors are removed. Removal of the N-type doped spacers from the P-type channel transistors is achieved by employing a protective layer and an additional mask.

An anneal is performed to drive the N-type dopants from the doped glass into the epi sidewalls, forming a $N^+$ layer 890. Typically, the conditions of the anneal are as follows: about 900° C. for 10 minutes in an inert ambient. However, the anneal conditions are not critical and are flexible to effectively form the $N^+$ layer 890 without seriously affecting the doping in the epi layer. For example, rapid thermal annealing (RTA) techniques are also useful to form the $N^+$ layer without disturbing the epi doping. The $N^+$ layer 890 provides continuity between the node $N^+$ diffusion and the $N^+$ outdiffusion from the poly in the trench. The $N^+$ layer is referred to as a buried strap. Diffusion from $N^+$ doped layer 865 on the gate conductors augments the source and drain doping, thus reducing diffusion resistance. A layer of TEOS is then deposited over the array and planarized to the top 895 of the gates.

Figure 8C:
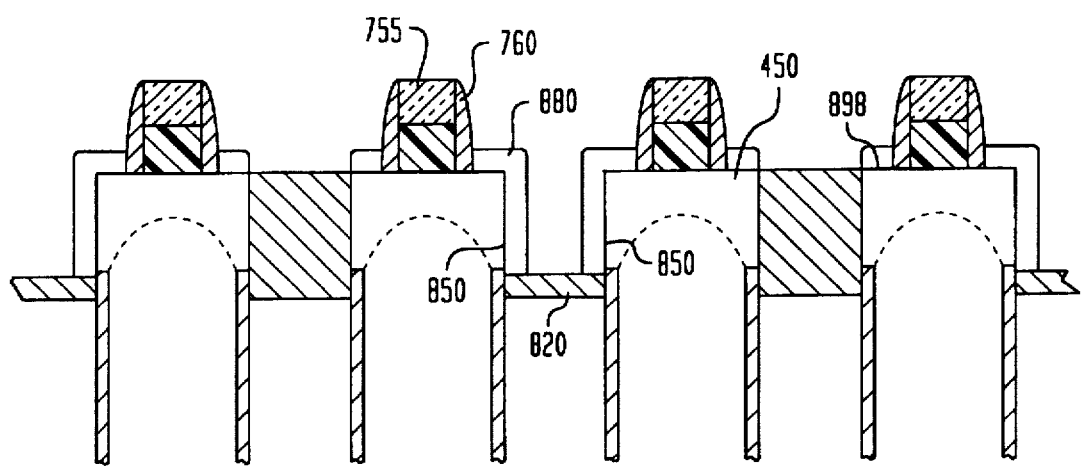

FIG. 8C shows an alternative technique for forming connections between the $N^+$ node diffusion and the $N^+$ outdiffusion from the poly in the trench. As shown, straps 880 are formed by epi growth techniques on the sidewalls 850. The straps are doped with N-type dopants during epi growth. To focus the epi formation on the epi sidewalls 850, selective epi technique is employed. Illustratively, spacers 760 and layers 820 comprise TEOS and gate cap 755 comprises nitride. As such, the epi growth is selective to the epi sidewalls and not to TEOS and nitride. Such selectivity is achieved using epi growth techniques which are similar to those employed from growing the epi layer 450. Although epi growth also occurs on the exposed portions 898 and 899 of the drain and source regions, such epi growth does not adversely affect device functions.

Formation of the strap using epi techniques advantageously eliminates lithographic and etching steps needed to remove the $N^+$ doped glass from the P-type channel peripheral devices. Also, epi straps do not need an anneal to complete the connection between the $N^+$ node diffusion and the $N^+$ outdiffusion from the poly in the trench. Elimination of the anneal lowers the overall thermal budget required to fabricate the device, which is desirable.

Figure 9A:
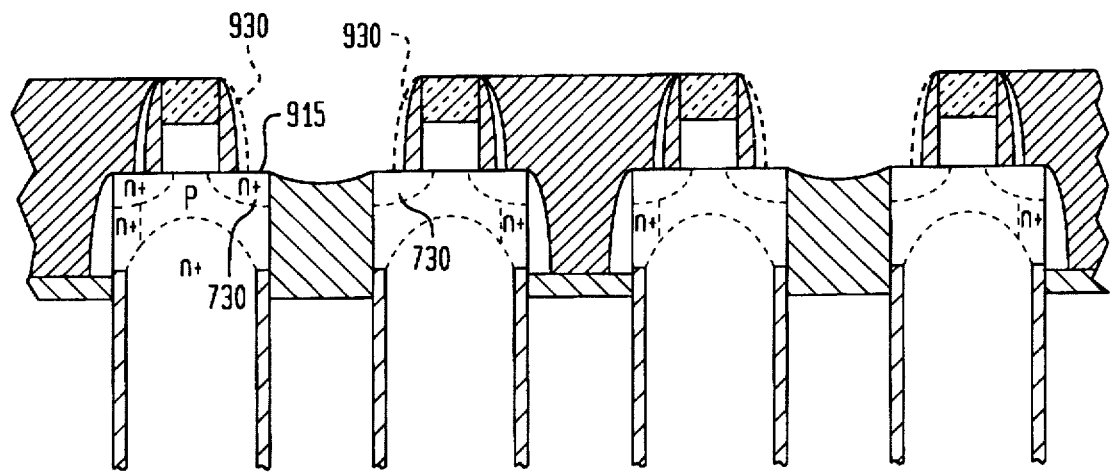
Figure 9B:
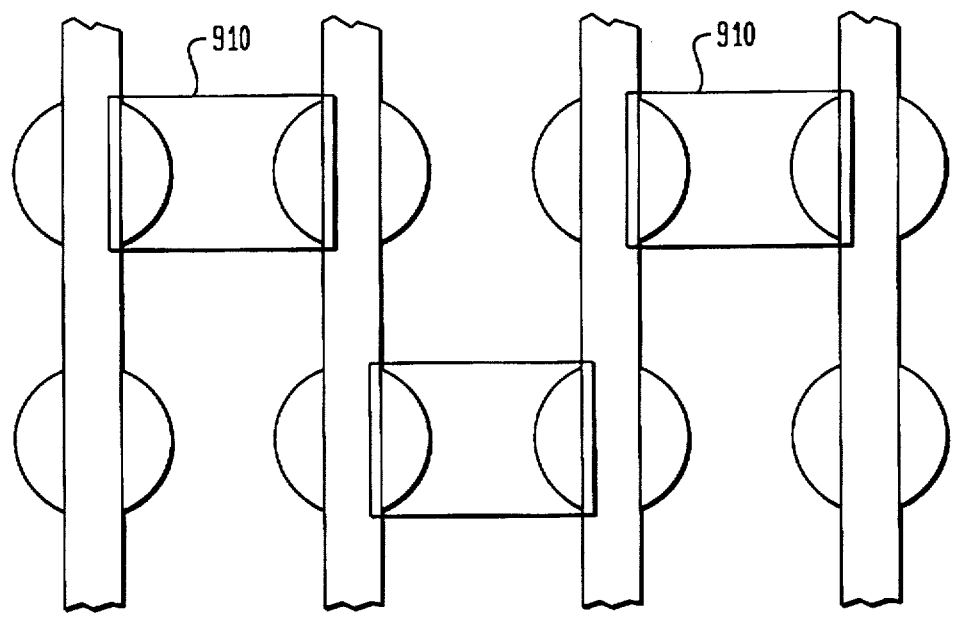

FIG. 9A–B show a mask used to define regions 910 between adjacent bitline diffusions. The TEOS in regions 910 is removed sufficiently to expose the top surface 915 of the silicon in these areas. To assure that the bitline diffusions are free of oxide, overetching is employed. Overetching causes small recessing of the TEOS fill between adjacent bitline diffusions 730. An isotropic CDE is used to remove the doped glass layer (depicted by dotted lines 930) from the nitride sidewall spacers, assuring adequate bitline contact areas. For embodiments utilizing epi straps, as shown in FIG. 8C, the CDE is not needed because doped glass is not used.

Figure 10A:
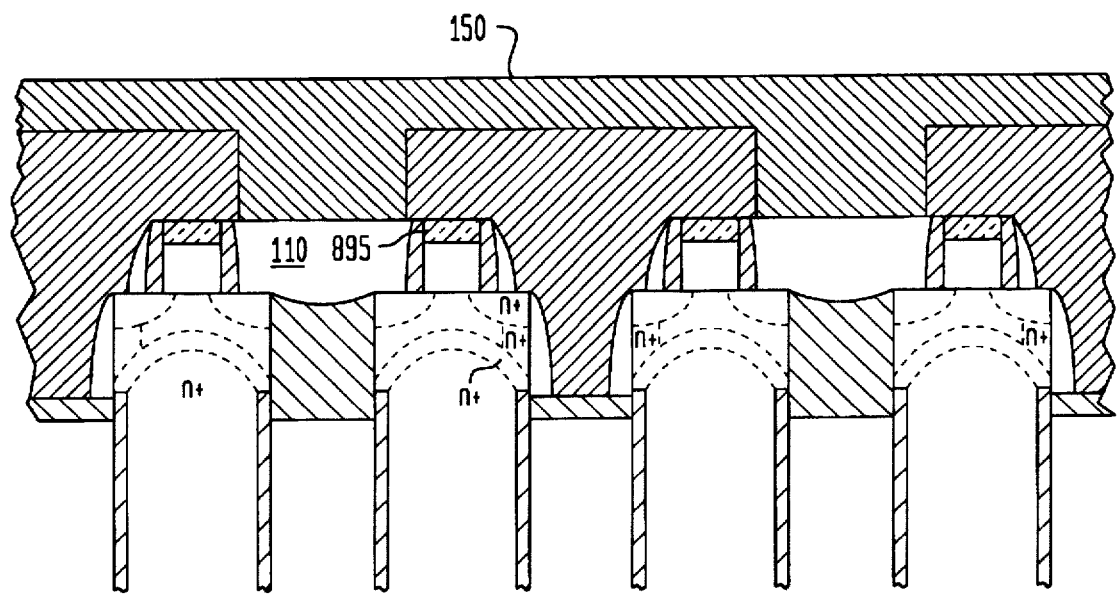
Figure 10B:
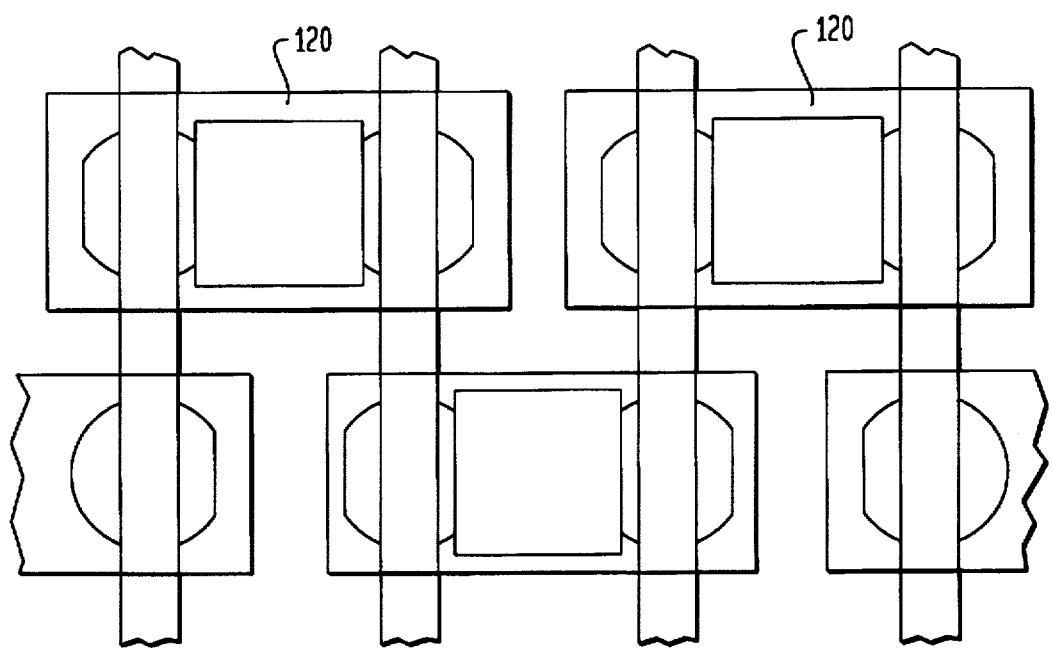

Referring to FIG. 10A–B, highly doped $N^+$ poly layer is then formed on the surface. The poly layer is planarized to the top of the gates 895 to form bitline contact areas 110. A MO dielectric such as TEOS is deposited by CVD and planarized, if necessary. Bitline contact openings 120 are defined in the MO dielectric layer. The MO dielectric layer at the bitline contact openings is recessed to expose the poly 110. A metal layer 150 is then deposited, filling the contact openings 120. The metal layer is then etched to form the bitline conductors.

The ability to locate devices spatially above the trenches allows more efficient three-dimensional design layouts, thereby increasing the density of devices for a given area. However, isolation between the devices at different layers may sometimes be compromised, particularly with low leakage (low power) applications (such as portable devices). For example, in the case of a DRAM cell having an access transistor fabricated on top of the epi layer above the trench, the bitline diffusion (i.e., the drain of the transistor) can "punch through" the epi layer, creating an electrical connection with the node diffusion. Punch through causes the stored charge to leak off the capacitor, adversely affecting the operability of the DRAM cell.

Figure 11:
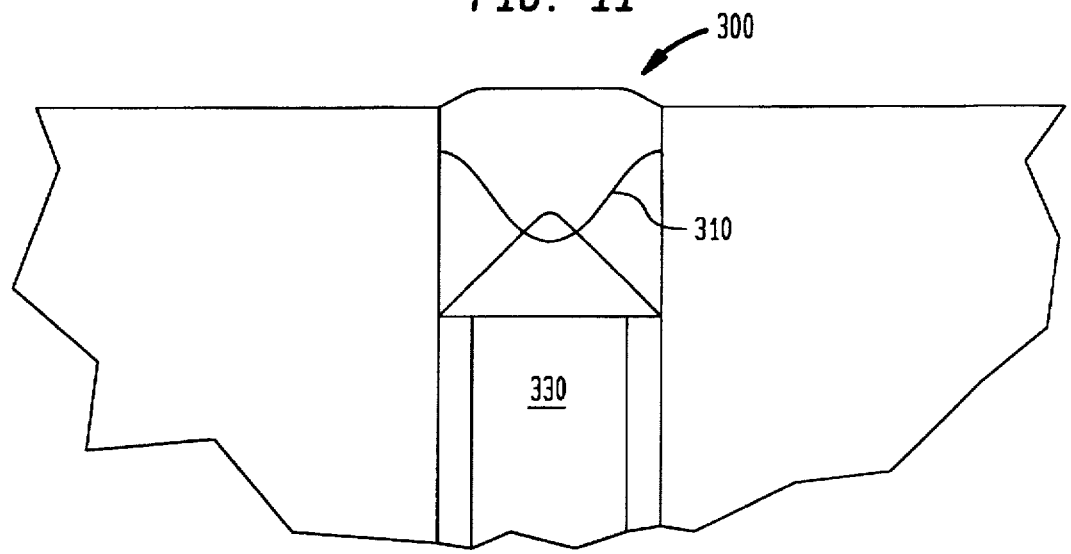
FIG. 11 shows a delta layer incorporated into the epitaxial silicon layer of FIGS. 2A–2E.

FIG. 11 is a trench capacitor 300 having a delta doping layer 310 to ensure isolation between the $N^+$ poly 330 in the trench and the bitline of a device fabricated thereon. The delta layer comprises dopant atoms having the same conductivity as the region above the storage node, i.e., the same as the epi region (i.e., $P^+$) of the transistor. The delta layer produces a local increase in dopant concentration, which raises the electrical barrier and resistance to punch through between the storage node and the bitline diffusion.

As shown in FIG. 11, the trench poly (prior to epi growth) is doped with an N-type dopant, and the delta layer is doped with a P-type dopant. The concentration of the dopants should be sufficient to prevent punch through without causing current leakage from the trench capacitor. Additionally, the delta layer is isolated from the junction depletion regions.

The delta layer is formed in conjunction with the epi growth process. As shown, lightly doped epi growth commences. The epi layer is doped with, for example, B of about $1\times10^{17}$ to $1\times10^{18}$ cm$^{-3}$. After undergoing partial formation of the epi layer, higher concentration of B is injected into the chamber to form the delta layer. The concentration of B used to form the delta layer is between about $3\times10^{17}$–$2\times10^{18}$. Concentration below about $3\times10^{17}$ is ineffective to prevent punch through while concentration above $2\times10^{18}$ tends to cause leakage currents. To avoid encroachment of the delta layer on the $N^+$ dopants from the trench, the thickness of the poly growth should be about 100 nm. After the layer is formed, injection of B is terminated and lightly doped epi growth continues until the trench is capped. The low temperature processes, which typically follow, limit the diffusion of the delta doping layer.

EXAMPLES

Example 1

In an experiment, a conventional trench having a diameter of 300 nm and depth of 8 µm was formed in the surface of a <100> wafer. The wafer is doped with about $10^{16} cm^{-3}$ of B. The top of the trench was recessed about 170 nm below the pad nitride-silicon interface. The wafer then underwent selective epitaxial growth in a reactor.

The wafer was prebaked in the reactor at about 925° C. for about 75 sec at a pressure of about 80 T in a H ambient. The prebake removes any native oxide at the interfaces prior to the epi growth. After the prebake, selective epi growth was performed in the reactor by reacting $SiH_2Cl_2$, HCL, and $H_2$ at about 908° C. for about 75 sec at a pressure of about 40 T. The process parameters for the reactants are as follows: about 200 sccm of $SiH_2Cl_2$, about 260 sccm of HCL, and 65 slm of $H_2$.

Figure 12:
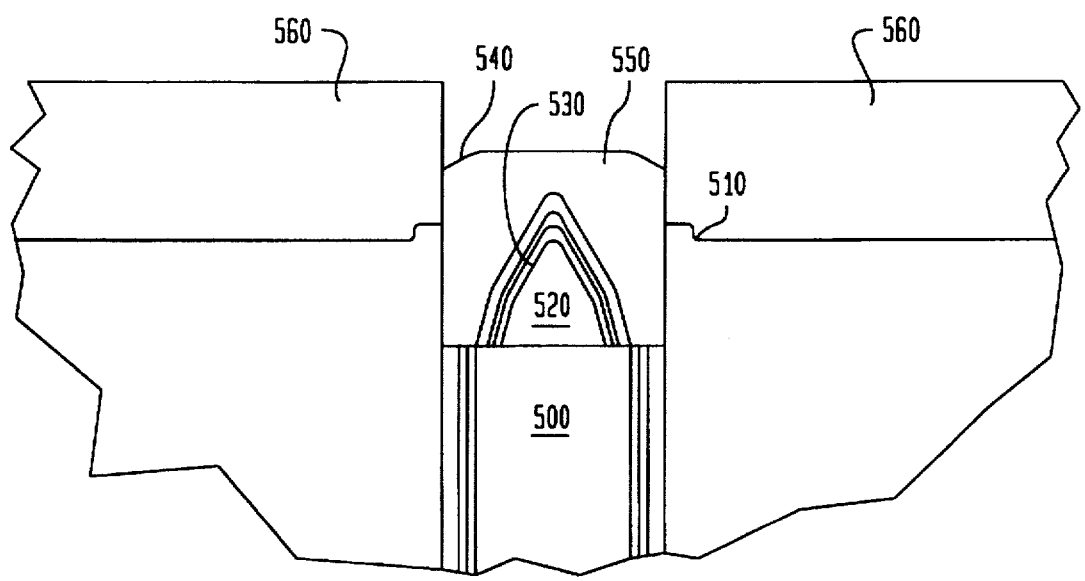
FIG. 12 is a TEM of epitaxial silicon layer capping a polysilicon filled trench.

FIG. 12 is a transmission Electron Micrograph (TEM) image of the trench 500 as fabricated from the above experiment. As shown, the poly 520 grows from the top of the trench, and the epi 510 grows from the trench sidewalls 560. The poly-epi interface 530 forms an angle of about 54° with the <100> wafer surface, creating a cone shaped poly growth. Because of the slower growth rate of the epi at the trench sidewalls, the epi surface 550 has a convex shape with <311> facets 540 near the trench sidewalls.

Example 2

Figure 13:
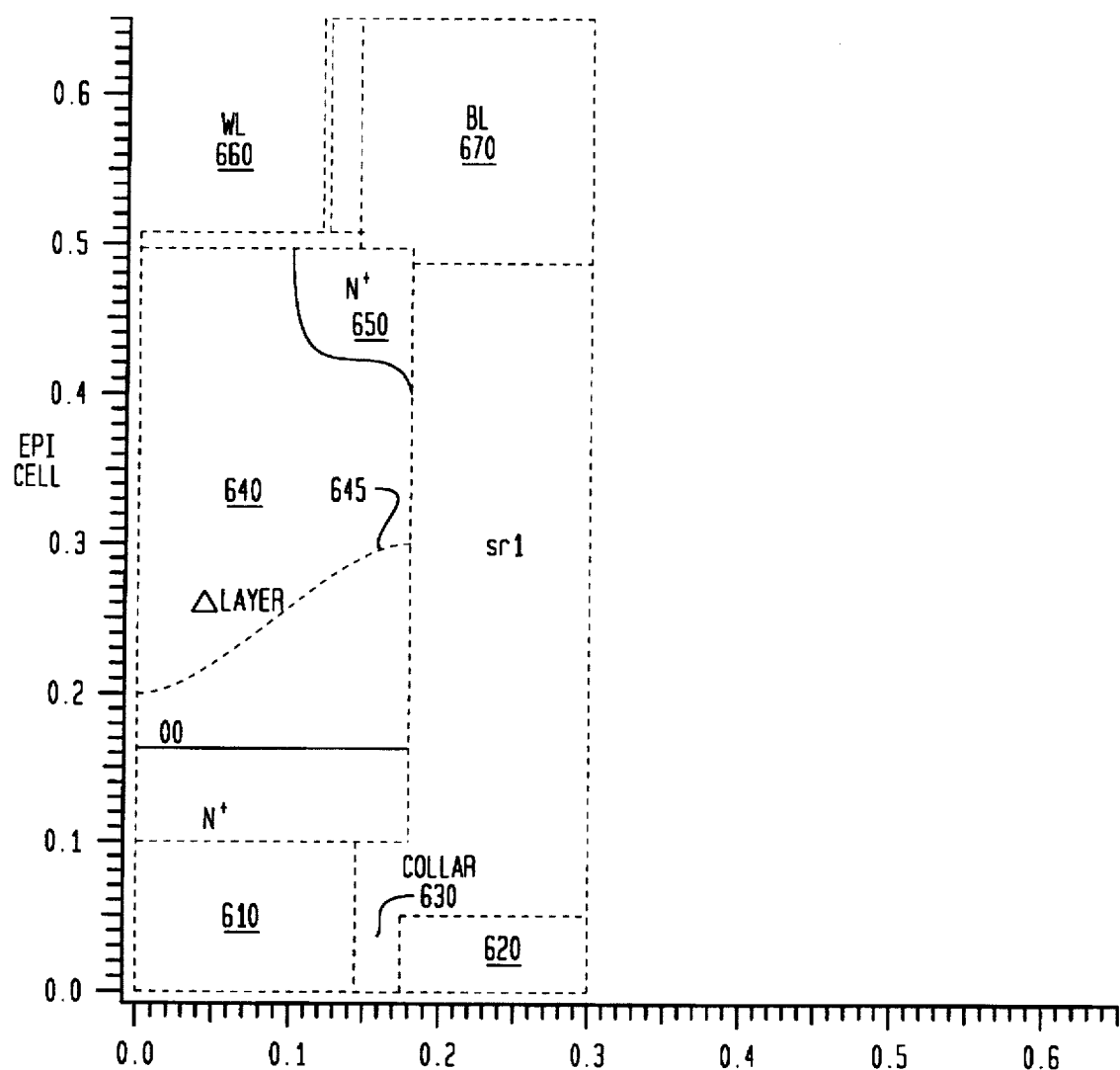
FIG. 13 is a model depicting the three-dimensional structure of FIG. 3.

An experiment was conducted to determine the effectiveness of the delta doping layer in reducing punch through. Referring to FIG. 13, a model depicting a three-dimensional structure 600, such as one used in a DRAM array. Structure 600 is similar to the three-dimensional structure described in FIG. 3. The model depicted includes the bitline diffusion 650. The numbers on the side and bottom represent the dimensions of the cell. As shown, the trench capacitor 610 is isolated from the silicon substrate 620 by a collar 630. On top of the trench capacitor is an epi layer 640 formed in accordance with the invention. The epi layer incorporates a delta doping layer formed within the epi layer. The delta layer is doped with B at a concentration of about $5 \times 10^{17}$ $cm^3$. STI region isolates the structure 600 from other structures in the DRAM array. Above the epi layer is the wordline 660 and bitline 670. The bitline is connected to the transistor by the bitline diffusion. Two other DRAM cells similar to DRAM cell 600 were also modeled. The first included a delta layer doped with about $2 \times 10^{18}$ $cm^3$ of B and the second was modeled without a delta layer.

Figure 14:
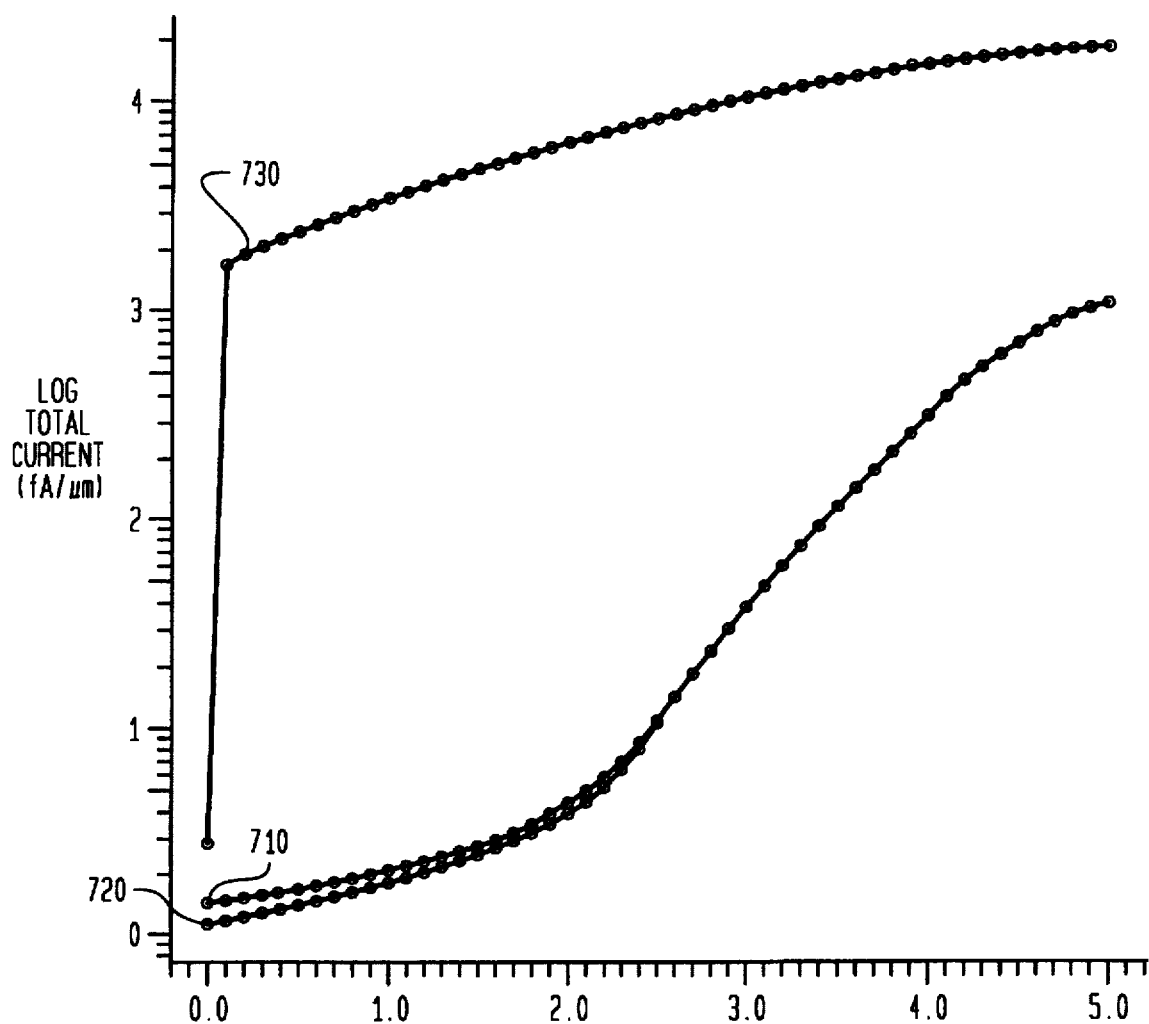
FIG. 14 shows total leakage currents of three-dimensional models of structures with and without a delta layer.

The DRAM cell models were simulated to measure the leakage current from the node of the trench capacitor 610 to the bitline 670 overlying the bitline diffusion 650. The simulations were conducted a finite element device sililator as described in Buturla et al., "A New Three-Dimensional Device Simulation Formulation", NASCODE: Proc. 6th Inter. Conf. Numerical Analysis of Semiconductor Devices and Integrated Circuits, Boole Press Ltd. (1989). Referring to FIG. 14, the logarithmic total leakage current of the DRAM cell models is plotted against voltage on the storage node with the bitline at 0.0 volts. Although the plot measures leakage current up to 5.0 V, most conventional high density DRAM arrays use about 1.8–2.0 V. Curves 710 and 720 represent the leakage current from the models having delta layers doped with $2 \times 10^{18}$ $cm^3$ and $5 \times 10^{18}$ $cm^3$ of B, respectively; Curve 730 represents the leakage current from models having no delta layer. Clearly, the models with the delta layers (curves 710 and 720) show significantly less leakage current than the model without the delta layer (curve 730). In particular, the delta layer effectively reduces the amount of leakage current to about 3 orders of magnitude less at levels at or below about 2 V. The reduction of leakage current indicates that the structure meets the target for low power, long retention time applications. Thus, for most current high density DRAM applications, the delta layer effectively reduces or eliminates punch through.

While the invention has been particularly shown and described with reference to various embodiments, it will be recognized by those skilled in the art that modifications and changes may be made to the present invention without departing from the spirit and scope thereof. Merely by way of example, the three-dimensional structure can be implemented with P-channel transistors. The scope of the invention should therefore be determined not with reference to the above description but with reference to the appended claims along with their full scope of equivalents.

We claim:

1. A method for facilitating three-dimensional device layout having a device structure comprising a first device having a non-single crystalline top surface and a second device having an active area, the method comprising the steps of:

providing a substrate having a single crystalline structure and a substantially planar substrate surface, wherein the substrate surface comprises a pad layer having a substantially planar pad surface;

fabricating the first device in the substrate surface such that the top surface of the first device is below the substrate surface to form a depression in the substrate surface;

forming an intermediate layer in the depression to a height above the pad surface, the intermediate layer having a single crystalline top plane;

planarizing the intermediate layer and the pad surface such that the top plane of the intermediate layer is substantially planar with the substrate surface; and fabricating a second device on the top plane, wherein the active region of the second device is within the top plane.

* * * * *